United States Patent
Jyumonji

(10) Patent No.: US 7,575,834 B2
(45) Date of Patent: Aug. 18, 2009

(54) PHASE SHIFTER FOR LASER ANNEALING

(75) Inventor: Masayuki Jyumonji, Kawasaki (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 558 days.

(21) Appl. No.: 11/276,992

(22) Filed: Mar. 20, 2006

(65) Prior Publication Data
US 2006/0275673 A1    Dec. 7, 2006

(30) Foreign Application Priority Data
Jun. 6, 2005    (JP) .............................. 2005-165476

(51) Int. Cl.
G03F 1/00    (2006.01)
(52) U.S. Cl. ........................................... 430/5
(58) Field of Classification Search ............. 430/5, 430/322, 323, 324, 394; 117/200, 201, 202, 117/203; 372/22
See application file for complete search history.

(56) References Cited

U.S. PATENT DOCUMENTS 6,987,035 B2 *    1/2006    Yamamoto et al. .......... 438/154
7,101,436 B2 *    9/2006    Taniguchi et al. ........... 117/200

FOREIGN PATENT DOCUMENTS

| JP | 10-144594 | 5/1998 |
|---|---|---|
| JP | 2000-228354 | 8/2000 |
| JP | 2003-68621 | 3/2003 |
| JP | 2004-259756 | 9/2004 |
| JP | 2005-86092 | 3/2005 |

* cited by examiner

Primary Examiner—Stephen Rosasco
(74) Attorney, Agent, or Firm—Oblon, Spivak, McClelland, Maier & Neustadt, P.C.

(57) ABSTRACT

An object of the present invention is to provide a phase shifter for laser annealing which is capable of effectively preventing the sticking of particles. A first layer and a third layer are made of quartz glass, and a two-dimensional pattern of fine grooves is formed in the surfaces of the layers. The first layer and the third layer are arranged so that a second layer is sandwiched between the layers in a state in which the surfaces provided with the grooves face each other. A peripheral edge portion of the first layer is laminated on that of the third layer by a spacer. The second layer is made of an inactive gas introduced between the first layer and the third layer.

7 Claims, 3 Drawing Sheets

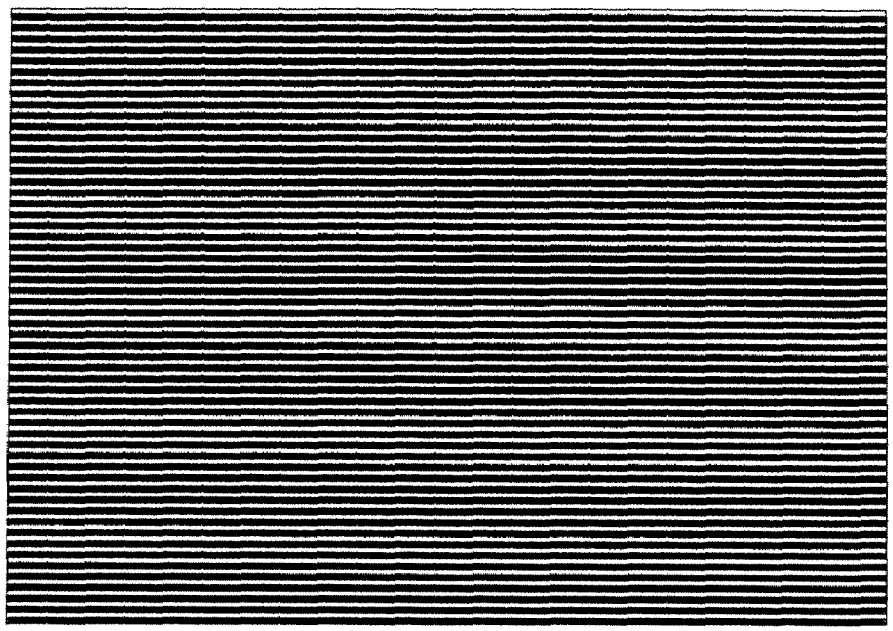
F I G. 6  ←100μm→
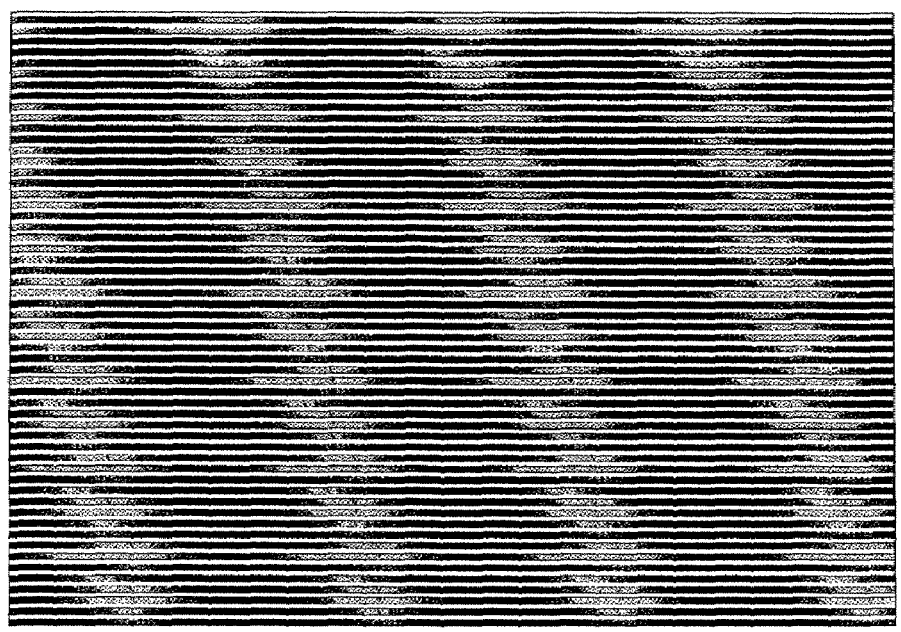
F I G. 7  ←100μm→

PHASE SHIFTER FOR LASER ANNEALING

CROSS-REFERENCE TO RELATED APPLICATIONS

This application is based upon and claims the benefit of priority from prior Japanese Patent Application No. 2005-165476, filed Jun. 6, 2005, the entire contents of which are incorporated herein by reference.

BACKGROUND OF THE INVENTION

1. Field of the Invention

The present invention relates to a phase shifter for use in irradiating a substrate to be treated with a luminous flux having a predetermined intensity distribution by use of interference of laser light having different phases. This phase shifter is used, for example, during laser annealing performed in order to grow crystal grains in a specific area of the surface of a substrate to be treated, when a thin film transistor is formed on the surface of the substrate to be treated.

2. Description of the Related Art

In a display device such as an active matrix type liquid crystal device or an organic electroluminescent display device, a large number of thin film transistors (TFTs) are formed on an insulating substrate made of glass, plastic or the like in order to individually drive pixels. As to an amorphous silicon (a-Si) film for use in source, drain, and channel areas of the TFT, since a forming temperature is low, the film can be comparatively easily formed by a vapor phase growth process, and mass productivity is also satisfactory, the film has been broadly used as a semiconductor thin film for forming the TFT.

However, the amorphous silicon film has a disadvantage that the film is inferior to a polycrystal silicon (poly-Si) film in physical properties such as conductivity (mobility of a-Si is lower than that of poly-Si by two or more digits). Therefore, it is necessary to establish a method of forming the source, drain, and channel areas of the TFT in the polycrystal silicon film in order to increase an operation speed of the TFT thereafter.

In the present situations, as a method of forming the polycrystal silicon film, for example, there is used an annealing process (hereinafter referred to as the excimer laser annealing [ELA] process) using excimer laser. The ELA process is applicable to various processes other than the forming of polycrystal silicon, when an average intensity (fluence) of the laser light is changed. For example, when the intensity of the laser light is set to a region having an only heating function, the process is usable in an impurity activation process required for forming the TFT. When the intensity of the laser light is excessively increased, a rapid temperature rise is caused, and therefore the process is usable for removing the film from the TFT. It is to be noted that the use of these phenomena is not limited to the TFT, and the phenomena are broadly applicable to a semiconductor manufacturing process.

This ELA process can be carried out in a temperature region (i.e., from room temperature to about 500° C.) in which a versatile glass substrate is usable (Matsumura, Surface Science Vol. 21, No. 5, pp. 278 to 287, 2000). In the ELA process, for example, after depositing an amorphous silicon film in a predetermined thickness (e.g., about 50 nm) on a substrate, the amorphous silicon film is irradiated with krypton fluoride (KrF) excimer laser light (wavelength 248 nm), xenon chloride (XeCl) excimer laser light (wavelength 308 nm) or the like. The amorphous silicon film is locally molten, recrystallized, and changed into the polycrystal silicon film having an average particle diameter of about 0.1 to 0.2 μm.

It has been clarified that the polycrystal silicon film has its limitation in order to increase the operation speed or improve performance in a display device such as a liquid crystal display device or the organic electroluminescent display device. This is because of a large number of crystal grain boundaries existing in an active layer remarkably increase fluctuations in a threshold voltage (Vth) of the TFT, and remarkably degrade operation characteristics in a case where the TFT is prepared using polycrystal silicon. Therefore, it has been demanded that the crystal grain boundaries of the active layer of each TFT be controlled or that crystals be grown to have large particle diameters to thereby remove the crystal grain boundaries.

The present inventors have investigated a method of setting a crystal diameter to be sufficiently larger than a TFT size and controlling generated positions of the crystal grains to thereby remove the crystal grain boundary from the active layer of the TFT. In this method, an optical device (hereinafter referred to as the phase shifter) for modulating a phase of the laser light is inserted midway in an optical path in which the amorphous silicon film is irradiated with the laser light, and a light intensity distribution of the laser light on the amorphous silicon film is adjusted into an appropriate shape to thereby increase the grain diameters (lateral crystal growth). As a result, a technology has been developed which is capable of controlling the position of a silicon single crystal having a large grain diameter of about two to seven microns to thereby realize lateral crystal growth. Furthermore, it has been found that in order to stably crystallize the film having a desired grain diameter, the light intensity distribution of the laser light with which the amorphous silicon film is irradiated in a micro region having a submicron level is particularly important for the crystallization in which the positions of the crystal grains having large diameters are controlled.

Since a light intensity gradient on the surface of the substrate to be treated is an important factor for the growth of the crystal grains, a sectional structure and a surface state of the phase shifter for forming the light intensity distribution are important. Additionally, particles (dust) easily stick to an uneven surface of the phase shifter. This is because the phase shifter is generally made of an insulating material such as glass, static electricity is therefore frequently generated, and, as a result, the particles in the atmosphere are attracted.

Since the stuck particles interrupt the laser light or disturb phase information, the following problem arises. That is, since the light intensity distribution is disturbed by the particles, unintended drop or rise of the light intensity distribution is generated. As a result, the lateral growth of the crystal whose position has been controlled is obstructed. When the particles are burnt on the surface of the phase shifter by irradiation with high-energy laser, the life of the phase shifter is reduced. It is considered that a device be devised in order to remove the particles (e.g., air is sprayed to the surface of a mask), but it is not possible to easily remove the particles stuck onto an uneven portion by the static electricity.

BRIEF SUMMARY OF THE INVENTION

The present invention has been developed in view of the above-described problems of the conventional phase shifter for laser annealing, and an object of the present invention is to provide a phase shifter for laser annealing to which particles are not easily stuck and which is capable of minimizing influences of the stuck particles.

The present invention is a phase shifter for laser annealing which irradiates the surface to be treated with a luminous flux having a regular intensity distribution during the laser annealing, the shifter comprising:

a first layer having a first refractive index in a wavelength of laser light for use;

a second layer disposed on the first layer and having a second refractive index which is different from the first refractive index in the wavelength of the laser light for use;

a third layer disposed on the second layer and having the first refractive index in the wavelength of the laser light for use; and a spacer which is disposed between the first layer and the third layer along peripheral edge portions of the first and third layers and which blocks the second layer from the outside, wherein a two-dimensional pattern of fine stepped portions is formed in at least one of an interface between the first layer and the second layer and an interface between the second layer and the third layer, whereby a phase difference is made between the laser light passed through the stepped portion and the laser light passed through a portion other than the stepped portion.

According to the phase shifter for laser annealing in the present invention, an optical path difference is generated between an optical path length of the laser light passed through the stepped portion and that of the laser light passed through the portion (i.e., reference surface) other than the stepped portion. The optical path difference corresponds to a value obtained by multiplying a height (or depth) of the stepped portion by a difference between the first refractive index and the second refractive index. This makes the phase difference between the laser light passed through the stepped portion and that passed through the portion other than the stepped portion. When the laser light having such phase difference interferes with each other on the surface to be treated, a distribution is generated in light intensity on the surface to be treated.

Therefore, it is possible to irradiate the surface to be treated with light having a regular intensity distribution by use of the phase shifter for laser annealing in the present invention. Consequently, it is possible to control generation of a crystal nucleus and growth of a crystal grain on the surface to be treated, when a temperature distribution pattern is adjusted in a case where a thin film constituting the surface to be treated melts and is next recrystallized.

Furthermore, according to the phase shifter for laser annealing in the present invention, the interface between the first layer and the second layer and that between the second layer and the third layer are isolated from the outside. Therefore, particles can be prevented from being stuck to the stepped portion. As a result, it is possible to inhibit the unintended drop or rise of the light intensity distribution, which is attributable to the particles. Generated positions and sizes of crystal grains can be stably controlled. This eliminates a problem that the particles are burnt in the stepped portion of the phase shifter by irradiation with a high-energy laser.

For example, the first and third layers are made of quartz glass, and the second layer is made of an inactive gas.

Alternatively, the first and third layers are made of quartz glass, and the second layer is made of porous silica.

In this case, the phase shifter for laser annealing preferably has a transmittance of 80% or more in the wavelength of the laser light for use.

Preferably, in order to prevent the interference of the laser light between two interfaces close to each other, a thickness d of the second layer is set to satisfy the following equation:

$d \geq \lambda^2/\Delta\lambda$, wherein $\lambda$ denotes the wavelength of the laser light, and $\Delta\lambda$ denotes an oscillation spectrum width.

It is to be noted that instead of constituting the phase shifter for laser annealing of three layers as described above, the shifter may be constituted of two layers.

In this case, a phase shifter for laser annealing in the present invention comprises:

a first layer having a first refractive index in a wavelength of laser light for use; and a second layer disposed on the first layer and having a second refractive index which is different from the first refractive index in the wavelength of the laser light for use, wherein a two-dimensional pattern of fine stepped portions is formed in an interface between the first layer and the second layer, whereby a phase difference is made between the laser light passed through the stepped portion and the laser light passed through a portion other than the stepped portion.

Also in this case, the phase shifter for laser annealing preferably has a transmittance of 80% or more in the wavelength of the laser light for use.

Moreover, in the present invention, a laser anneal apparatus which irradiates a semiconductor thin film with a luminous flux having a regular light intensity distribution to crystallize the semiconductor thin film, the apparatus comprising:

a laser light source;

an illumination system which converges laser light emitted from the laser light source onto a focal point;

a phase shifter disposed in the focal point of the illumination system; and an image-forming optical system disposed between the phase shifter and the semiconductor thin film, wherein the phase shifter for laser annealing, provided with any sectional structure described above, is used as the phase shifter.

BRIEF DESCRIPTION OF THE SEVERAL VIEWS OF THE DRAWING

FIG. 6 is a schematic diagram of a dark-field photograph showing a tissue crystallized using the phase shifter for laser annealing in the present invention (a case where there is not any interference); and FIG. 7 is a schematic diagram of a dark-field photograph showing a tissue crystallized using the phase shifter for laser annealing in the present invention (a case where there is the interference).

DETAILED DESCRIPTION OF THE INVENTION

EMBODIMENT 1

Figure 1:
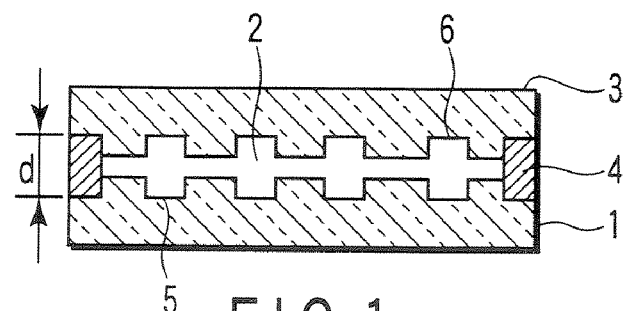
FIG. 1 is a schematic diagram showing an example of a cross-sectional structure of a phase shifter for laser annealing in the present invention.

FIG. 1 shows a schematic sectional structure of a phase shifter for laser annealing in the present invention. In the drawing, reference number 1 denotes a first layer, 2 denotes a second layer, and 3 denotes a third layer.

The first layer 1 and the third layer 3 are made of, for example, quartz glass. A two-dimensional pattern is formed with a fine grooves 5 (stepped portions) in the surface of the first layer 1. Similarly, a two-dimensional pattern is formed with fine grooves 6 (stepped portions) in the surface of the third layer 3. The first layer 1 and the third layer 3 are arranged so that the second layer 2 is sandwiched between the first layer and the third layer in a state in which the surfaces provided with the grooves 5, 6 face each other. A peripheral edge portion of the first layer 1 is laminated on that of the third layer 3 via a spacer 4.

In this example, the second layer 2 is constituted of an inactive gas introduced between the first layer 1 and the third layer 3. The surface of the spacer 4 is polished to a mirror face. A material of the spacer 4 may be a metal such as aluminum, chromium, or stainless steal, quartz, or glass. The spacer 4 preferably has a thermal expansion coefficient equal to that of a phase shifter if possible. This prevents breakage of the phase shifter caused by a temperature rise accompanying transmission of intense laser light. Each layer is preferably bonded to the spacer 4 by optical contact (bonding under pressure by the mirror-face polishing). This bonding may also be performed using silicone oil or epoxy agent. In this case, attention needs to be paid to prevent bonded surface from being introduced into an optical path of the laser light. In the second layer 2, instead of the inactive gas (e.g., $N_2$, He, Ne or the like), clean air may be used depending on an intensity of laser light.

As to arrangement and sectional shapes of the grooves 5 and 6 in the surfaces of the first layer 1 and the third layer 3 in a section perpendicular to each of the layers 1 to 3 shown in FIG. 1, there is a mirror-face symmetric relation between the two layers between which a central symmetric face is sandwiched.

It is to be noted that in this example, an interval d (value in a bottom portion of the grooves 5, 6) between the first layer 1 and the third layer 3 is designed to 60 μm in consideration of performance of a projection lens. A reason why the interval is disposed between the first layer 1 and the third layer 3 is that if this interval is excessively small, interference occurs while the laser light passes through the interval. Such interference can be prevented, when the above interval d is set to satisfy the following equation:

$$d \geq \lambda^2 / \Delta\lambda,$$

wherein λ denotes a wavelength of the laser light, and Δλ denotes an oscillation spectrum width of the laser light. It is to be noted that the problem of such interference of the laser light will be described later in detail.

EMBODIMENT 2

Figure 2:
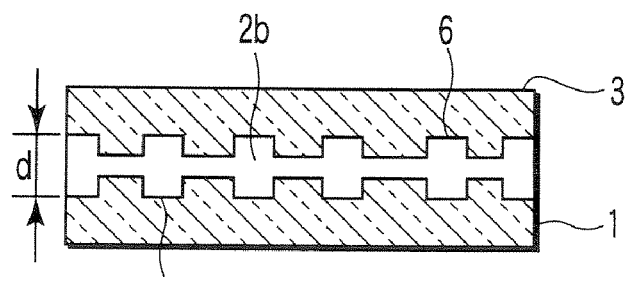
FIG. 2 is a schematic diagram showing another example of a cross-sectional structure of a phase shifter for laser annealing in the present invention.

FIG. 2 shows another example of a cross-sectional structure of a phase shifter for laser annealing in the present invention. A sectional shape of each layer is the same as that of the above example shown in FIG. 1.

In this example, a first layer 1 and a third layer 3 are made of quartz glass, and a second layer 2b is made of porous silica (e.g., trade name "Silica Aerogel" manufactured by U.S. Aerogel Inc.). Porous silica has a light refractive index of 1.01 to 1.06, which is remarkably close to that of air. There is a sufficient difference from quartz glass (refractive index: 1.45) constituting the first layer 1 and the third layer 3. Furthermore, porous silica has a comparatively high transmittance of about 80% with respect to the laser light (wavelength: 248 nm) emitted from KrF excimer laser, and decay of the laser light passed through the phase shifter can be minimized.

This phase shifter will be assembled as follows. Porous silica is sandwiched between the first layer 1 and the third layer 3, and a pressing load is applied between these layers. Next, a spacer (not shown) is attached between the first layer 1 and the third layer 3 along peripheral edge portions of the first layer 1 and the third layer 3. Subsequently, the spacer is bonded to the first layer 1 and the third layer 3. In consequence, a space between the first layer 1 and the third layer 3 is blocked to prevent entrance of particles. The particles are generated by ablasion of a substrate surface at a time when a substrate to be treated is irradiated with the laser light. Such particles are scattered in the apparatus, and there is a fear that they reach the periphery of the phase shifter.

EMBODIMENT 3

Figure 3:
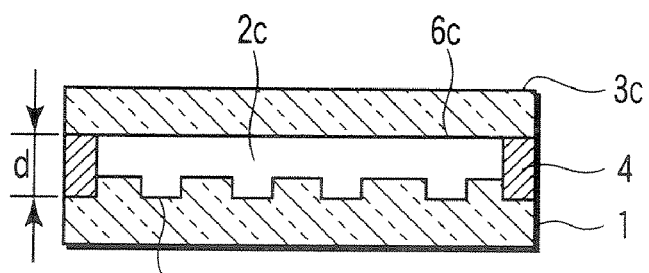
FIG. 3 is a schematic diagram showing still another example of a cross-sectional structure of a phase shifter for laser annealing in the present invention.

FIG. 3 shows still another example of a sectional structure of a phase shifter for laser annealing in the present invention. This example is a modification of the above example shown in FIG. 1. In this example, a third layer 3c is constituted of a flat plate of quartz glass. That is, any two-dimensional pattern of fine stepped portions is not formed in an interface 6c between a second layer 2c and the third layer 3c. Another respect is similar to that of the above example shown in FIG. 1.

EMBODIMENT 4

Figure 4:
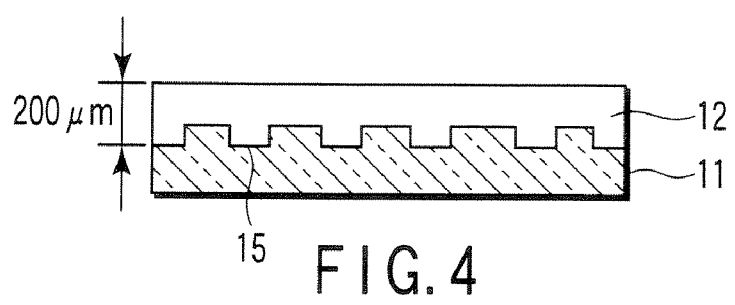
FIG. 4 is a schematic diagram showing a further example of a sectional structure of a phase shifter for laser annealing in the present invention.

FIG. 4 shows a further example of a sectional structure of a phase shifter for laser annealing in the present invention. In this example, the phase shifter is constituted of two layers, that is, a first layer 11 and a second layer 12, and a two-dimensional pattern is formed with fine grooves 15 in an interface between two layers 11 and 12.

In this example, the first layer 11 is made of quartz glass, and the second layer 12 is porous silica described above. Two layers are bonded to each other by application of a pressing load. Peripheral edge portions are bonded to each other with an adhesive (not shown) in the interface between the first layer 11 and the second layer 12.

EMBODIMENT 5

Figure 5:
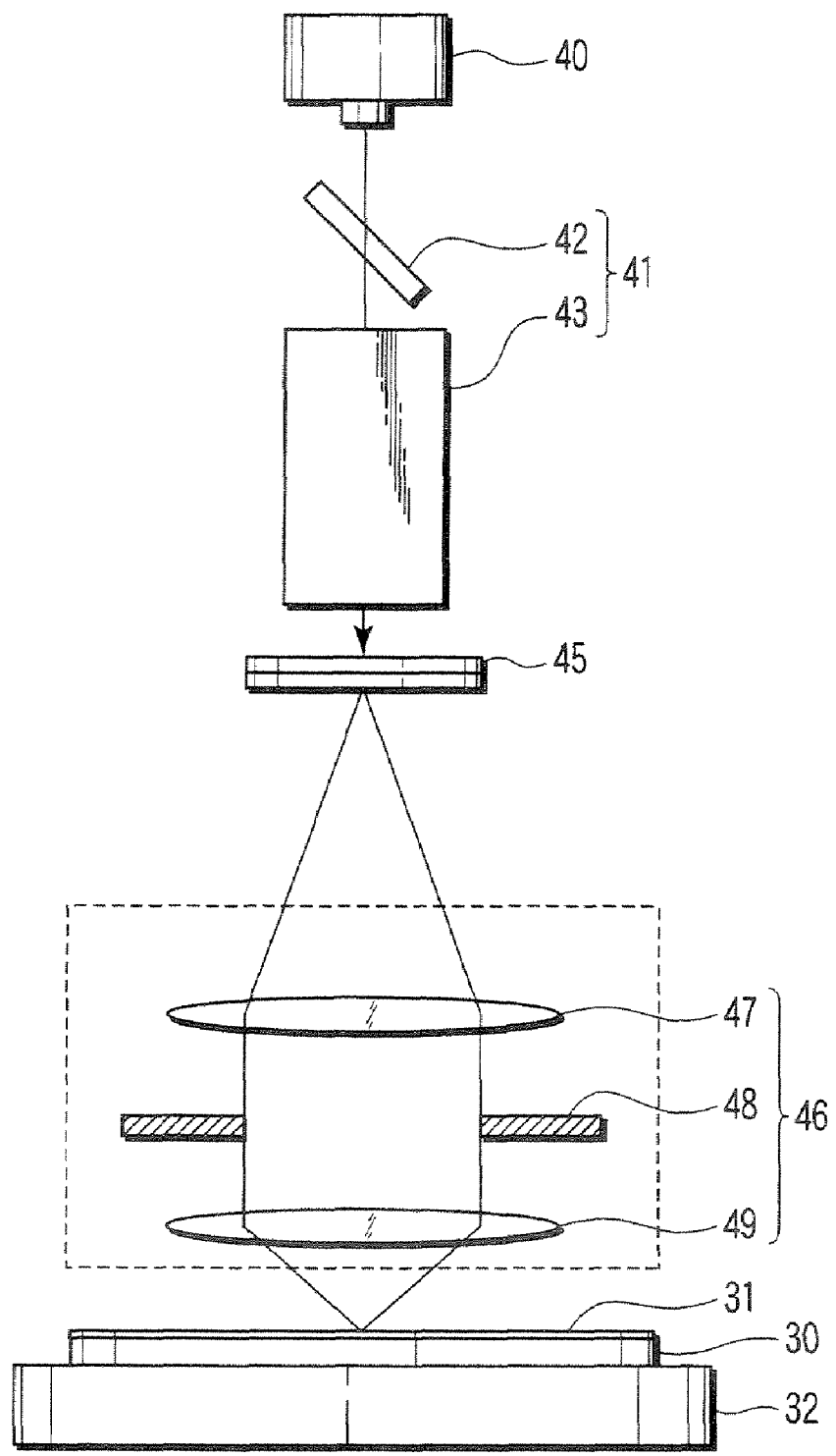
FIG. 5 is a diagram showing a schematic constitution of a laser anneal apparatus using a phase shifter for laser annealing in the present invention.

FIG. 5 shows an outline of a laser anneal apparatus for use in crystallizing a semiconductor thin film by use of a phase shifter for laser annealing in the present invention. In the drawing, reference number 31 denotes a semiconductor thin film, 40 denotes a laser light source, 41 denotes an illumination system, 45 denotes a phase shifter, and 46 denotes an image-forming optical system.

The semiconductor thin film 31 is deposited on the surface of a substrate 30 to be treated. The substrate 30 to be treated is held on a substrate stage 32. The illumination system 41 is provided with an attenuator 42 and a homogenizer 43. The image-forming optical system 46 is provided with a first condenser lens 47, an aperture 48, and a second condenser lens 49.

An intensity (laser fluence) of laser light emitted from the laser light source 40 (e.g., KrF excimer laser) is adjusted by the attenuator 42, and a two-dimensional distribution of intensities is homogenized in the homogenizer 43. Thereafter, the light enters the phase shifter 45. The face of the phase shifter 45 in which stepped portions is formed is disposed in a focal position of the illumination system 41. The laser light whose phase has been modulated through the phase shifter 45 passes through the image-forming optical system 46 to enter the substrate 30 to be treated. The semiconductor thin film 31 on the surface of the substrate 30 to be treated is position in the focal position of the image-forming optical system 46.

It is to be noted that as to a constitution of the homogenizer 43, a system is generally adopted in which the laser light is split into a plurality of lights by use of a first fly eye lens, and thereafter the laser lights are superimposed upon one another by use of a second fly eye lens to thereby form a homogeneous light intensity.

The image-forming optical system 46 reduces the light passed through the phase shifter 45, and forms the light into an image on the surface of the substrate 30 to be treated. A pattern of the light intensity distribution formed by the phase shifter 45 is two-dimensionally reduced by the image-forming optical system 46, and projected on the surface of the substrate 30 to be treated. Reduction by the image-forming optical system 46 is, for example, one fifth. In this manner, the semiconductor thin film 31 on the surface of the substrate 30 to be treated can be molten using laser light having a predetermined light intensity distribution pattern, next solidified, and accordingly crystallized.

Next, there will be described the problem of the laser light interference in the phase shifter having the cross-sectional structure shown in each of FIGS. 1 to 3.

Laser space coherency is defined by $\lambda^2/\Delta\lambda$, wherein $\lambda$ denotes a wavelength of the laser light, and $\Delta\lambda$ denotes a half-value width (FWHM) of the laser wavelength. The interference occurs in a case where a space thickness is smaller than this value. Therefore, in the phase shifter having an intermediate layer (second layer 2, 2b, or 2c) shown in each of FIGS. 1 to 3, assuming that an interval between the first layer 1 and the third layer 3 is d, $d \geq \lambda^2/\Delta\lambda$ needs to result.

To confirm this, an experiment was carried out using the phase shifter provided with the sectional structure shown in FIG. 3 and the laser anneal apparatus shown in FIG. 5. In this experiment, KrF excimer laser was used in the laser light source 40. As a result of measurement, this laser had a wavelength of 0.248 μm. Moreover, $\Delta\lambda$ was about 0.0007 μm. Therefore, a coherence length was about 87.9 μm.

To verify whether or not this value was adequate, the semiconductor thin film was crystallized by the laser annealing by use of the phase shifter in which d (FIG. 3) was set to 30 μm and 110 μm. The laser light fluence was set to about 700 mJ/cm². It has been confirmed that either of the interface between the first layer 1 and the second layer 2c of the phase shifter and the interface between the second layer 2c and the third layer 3c is in a range of a depth of focus (DOF) of the image-forming optical system.

When the surface of the laser-annealed substrate to be treated was observed, a fine regularly striped pattern was observed in a dark-field photograph taken with an optical microscope as shown in a schematic diagram of FIG. 6 in the substrate 30 laser-annealed using the phase shifter in which d=110 μm was set. This striped pattern is constituted of an area (black band-like portion) crystallized in accordance with the pattern of the stepped portion of the phase shifter. There was not observed any abnormality supposedly attributable to the interference of the laser light in the interval.

On the other hand, in the substrate 30 laser-annealed using the phase shifter in which d=30 μm was set, as shown in a schematic diagram of FIG. 7, in addition to a striped pattern similar to that of the above example, there was observed a coarsely striped pattern having a pitch of about 120 μm in a state in which the pattern crossed the above pattern at about 75 degrees in a dark-field photograph by an optical microscope. This second striped pattern is constituted of an area having a different crystallized state, and corresponds to interference fringes.

What is claimed is:

1. A phase shifter for laser annealing which irradiates the surface to be treated with a luminous flux having a regular intensity distribution during the laser annealing, the shifter comprising:

a first transparent layer having a first refractive index in a wavelength of laser light for use;

a second transparent layer disposed on the first transparent layer and having a second refractive index which is different from the first refractive index in the wavelength of the laser light for use;

a third transparent layer disposed on the second transparent layer and having the first refractive index in the wavelength of the laser light for use; and a spacer which is disposed between the first transparent layer and the third transparent layer along peripheral edge portions of the first and third transparent layers and which blocks the second transparent layer from the outside so as to prevent particles from entering between the first transparent layer and the third layer, wherein a two-dimensional pattern of fine stepped portions is formed in at least one of an interface between the first transparent layer and the second transparent layer and an interface between the second transparent layer and the third transparent layer, whereby a phase difference is made between the laser light passed through the stepped portion and the laser light passed through a portion other than the stepped portion, and wherein a thickness of the second transparent layer is selected so as to prevent interference of the laser light while the laser light passes through the second transparent layer.

2. The phase shifter for laser annealing according to claim 1, wherein the first and third transparent layers are made of quartz glass, and the second transparent layer is made of an inactive gas.

3. The phase shifter for laser annealing according to claim 1, wherein the first and third transparent layers are made of quartz glass, and the second transparent layer is made of porous silica.

4. The phase shifter for laser annealing according to claim 3, having a transmittance of 80% or more in the wavelength of the laser light for use.

5. The phase shifter for laser annealing according to claim 1, wherein a thickness d of the second transparent layer is set to satisfy the conditions:

$$d \geq \lambda^2/\Delta\lambda,$$

wherein $\lambda$ denotes the wavelength of the laser light, and $\Delta\lambda$ denotes an oscillation spectrum width.

6. The phase shifter for laser annealing according to claim 1, having a transmittance of 80% or more in the wavelength of the laser light for use.

7. A phase shifter for laser annealing which irradiates the surface to be treated with a luminous flux having a predetermined intensity distribution during the laser annealing, the shifter comprising:

a first transparent layer having a first refractive index in a wavelength of laser light for use; and a second transparent layer disposed on the first transparent layer so as to prevent particles from depositing on the first transparent layer, and having a second refractive index which is different from the first refractive index in the wavelength of the laser light for use, wherein a two-dimensional pattern of fine stepped portions is formed in an interface between the first transparent layer and the second transparent layer, whereby a phase difference is made between the laser light passed through the stepped portion and the laser light passed through a portion other than the stepped portion, and wherein a thickness of the second transparent layer is selected so as to prevent interference of the laser light while the laser light passes through the second transparent layer.

* * * * *